United States Patent
Pi et al.

(10) Patent No.: US 8,896,015 B2
(45) Date of Patent: Nov. 25, 2014

(54) LED PACKAGE AND METHOD OF MAKING THE SAME

(75) Inventors: Bo Pi, Carlsbad, CA (US); Li Xu, Saratoga, CA (US)

(73) Assignee: Axlen, Inc., Wilmington, DE (US)

( * ) Notice: Subject to any disclaimer, the term of this patent is extended or adjusted under 35 U.S.C. 154(b) by 0 days.

(21) Appl. No.: 13/806,696

(22) PCT Filed: Jun. 27, 2011

(86) PCT No.: PCT/US2011/042065
§ 371 (c)(1),
(2), (4) Date: Dec. 21, 2012

(87) PCT Pub. No.: WO2011/163674
PCT Pub. Date: Dec. 29, 2011

(65) Prior Publication Data
US 2013/0099275 A1    Apr. 25, 2013

Related U.S. Application Data

(60) Provisional application No. 61/358,844, filed on Jun. 25, 2010.

(51) Int. Cl.
*H01L 33/64*   (2010.01)
*H01L 33/62*   (2010.01)
*H01L 33/48*   (2010.01)

(52) U.S. Cl.
CPC ............... *H01L 33/64* (2013.01); *H01L 33/641* (2013.01); *H01L 33/644* (2013.01); *H01L 33/642* (2013.01); *H01L 33/486* (2013.01); *H01L 2224/48247* (2013.01); *H01L 2933/0075* (2013.01); *H01L 33/62* (2013.01)
USPC ........................................................... 257/99

(58) Field of Classification Search
USPC ........................................................... 257/99
See application file for complete search history.

(56) References Cited

U.S. PATENT DOCUMENTS

| | | | |
|---|---|---|---|
| 8,105,854 B2 * | 1/2012 | Lee et al. ................ | 438/27 |
| 2008/0090338 A1 * | 4/2008 | Tredwell et al. ........... | 438/151 |
| 2009/0315060 A1 * | 12/2009 | Kim ..................... | 257/98 |
| 2010/0193807 A1 * | 8/2010 | Park .................... | 257/88 |
| 2012/0091493 A1 * | 4/2012 | Lin et al. ............... | 257/98 |

* cited by examiner

*Primary Examiner* — Thao P Le
(74) *Attorney, Agent, or Firm* — Perkins Coie LLP

(57) ABSTRACT

LED packages and their fabrication techniques are disclosed to provide LED package with improved thermal dissipation based on one or more thermally conductive channels or studs. In one implementation, a LED package includes a plastic body structured to have a hole that penetrates through the plastic body; a metal contact formed on the plastic body at one side of the hole to cover the hole; a LED mounted to the metal contact at a location that spatially overlaps with the hole; and a stud formed in the hole in contact with the metal contact at a first end of the stud and extending to an opening of the hole at a second end of the stud, the stud being formed of a thermally conductive material to transfer heat from the LED through the metal contact and the stud to dissipate the heat at the opening of the hole via the second end of the stud.

11 Claims, 5 Drawing Sheets

1st step,
Use regular process to make sheet metal framed plastic mold package, with a hole in the bottom in the plastic molding that part of the metal in the back surface is exposed 2nd step,
Attach a metal stud to fill the hole in the plastic molding, that the attachment can be high temperature solder, or metal/metal welding 1st step,
Use regular process to make sheet metal framed plastic mold package, make a array of holes in the bottom in the plastic molding that part of the metal in the back surface is exposed 2nd step,
fill the holes in the plastic molding, with temperature solder

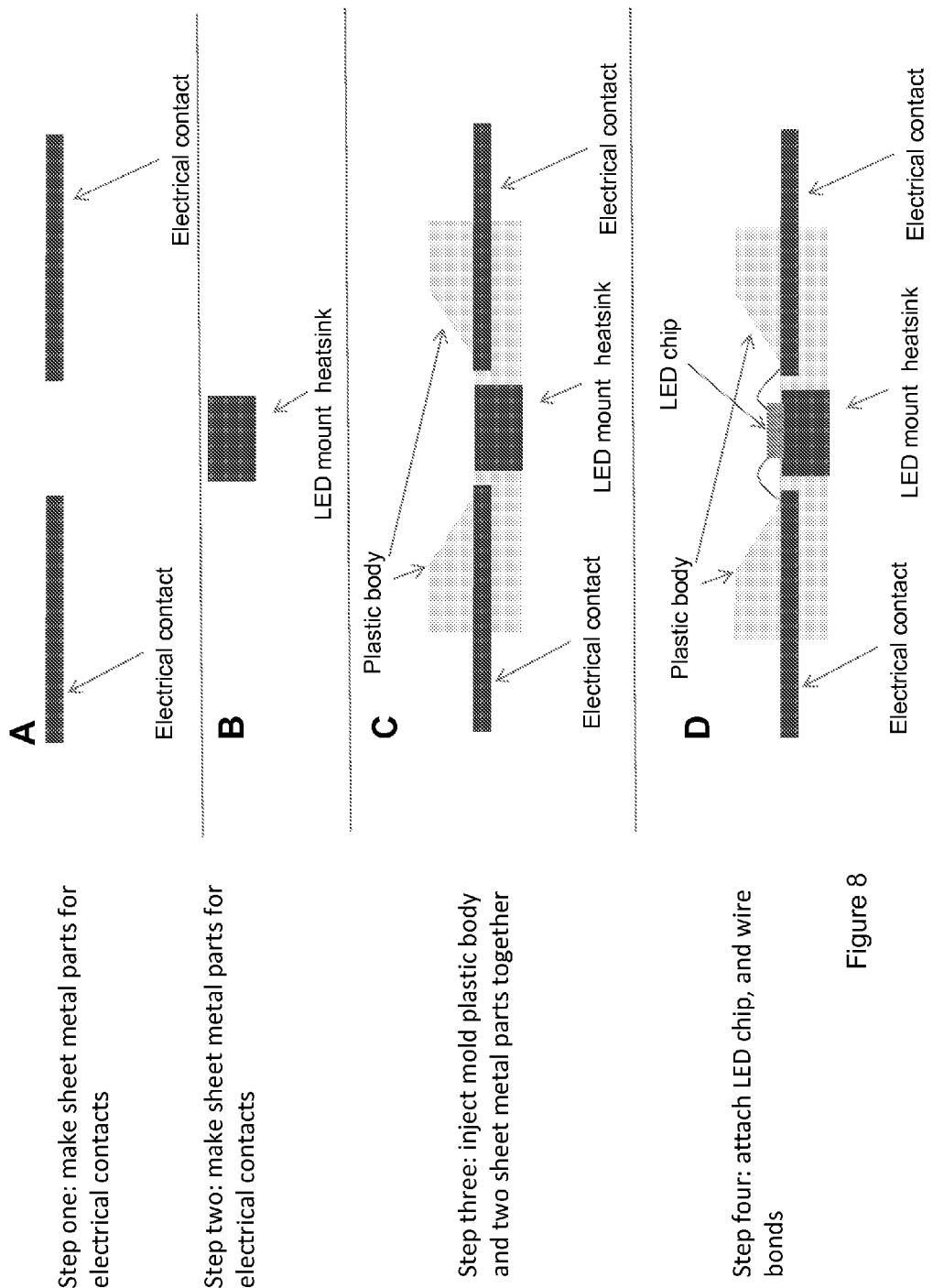

LED PACKAGE AND METHOD OF MAKING THE SAME

PRIORITY CLAIM AND RELATED APPLICATIONS

This application is a 35 USC §371 National Stage application of, and claims priority of, International Application No. PCT/US2011/042065 filed Jun. 27, 2011, which further claims the benefit of priority to U.S. Provisional Application No. 61/358,844 entitled "A LED PACKAGE AND METHOD OF MAKING THE SAME" filed Jun. 25, 2010, the disclosure of which is incorporated by reference as part of the specification of this document.

BACKGROUND

This patent document is related to light-emitting diode (LED) devices.

Light-emitting diode (LED) devices can be constructed by placing various structures over the LED chip with one or more LEDs.

SUMMARY

LED packages and their fabrication techniques are disclosed to provide LED package with improved thermal dissipation based on one or more thermally conductive channels or studs. In one implementation, a LED package includes a plastic body structured to have a hole that penetrates through the plastic body; a metal contact formed on the plastic body at one side of the hole to cover the hole; a LED mounted to the metal contact at a location that spatially overlaps with the hole; and a stud formed in the hole in contact with the metal contact at a first end of the stud and extending to an opening of the hole at a second end of the stud, the stud being formed of a thermally conductive material to transfer heat from the LED through the metal contact and the stud to dissipate the heat at the opening of the hole via the second end of the stud.

In another implementation, a LED package includes two sets of metal parts, a plastic body, one set for electrical connections, and one for heat sink and LED chip mount. The metal parts can be made of copper or copper alloys or can be shaped with die cutting. The metal part surface can be polished or can be coated with silver or gold. The plastic body can be white to improve light coupling efficiency.

These and other devices and various methods for fabricating the LED packages are described in detail in the drawings, the description and the claims.

BRIEF DESCRIPTION OF THE DRAWINGS

FIGS. 6, 7 and 8 show additional examples of LED packages and fabrication.

DETAILED DESCRIPTION

LED packages and devices can be designed for various applications including devices and packages for high power applications with power greater than a power level (e.g., 1 W), which can be made with ceramic substrate materials in some cases, and devices and packages for low power applications with power less than a particular power level (e.g., 1 W), which can be made with plastic frame materials in some cases. The low power type LED packages and devices may have lower production cost than high power type LED packages and devices.

Figure 1:
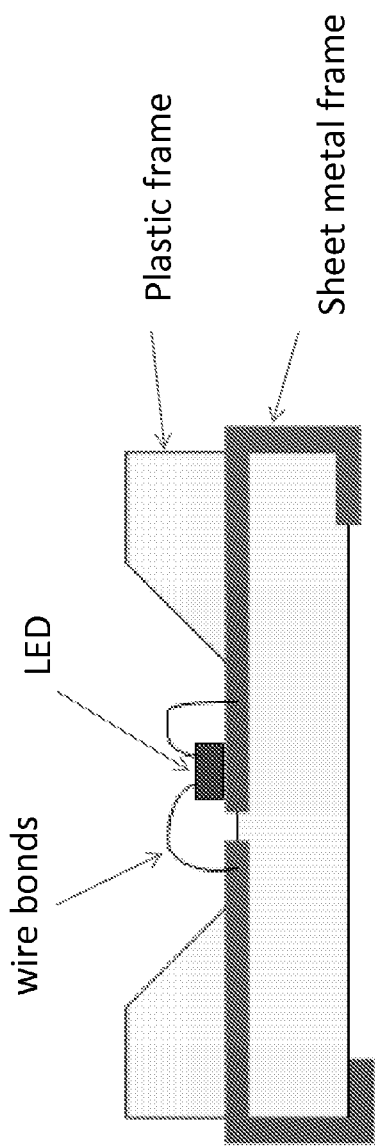
FIG. 1 shows an example of a low power LED package design.

FIG. 1 illustrates an example of a plastic frame body, sheet metal inside package design of a LED package that may be used for low power type LED packages and devices. The LED is located on the sheet metal frame and wire bonds are formed to provide the electrical contacts. Under the design of this LED package, the heat from LED is difficult to transfer out of the package and thus the LED junction temperature can be high at high power operation. This design may be sufficient for low power LED operation.

Figure 2:
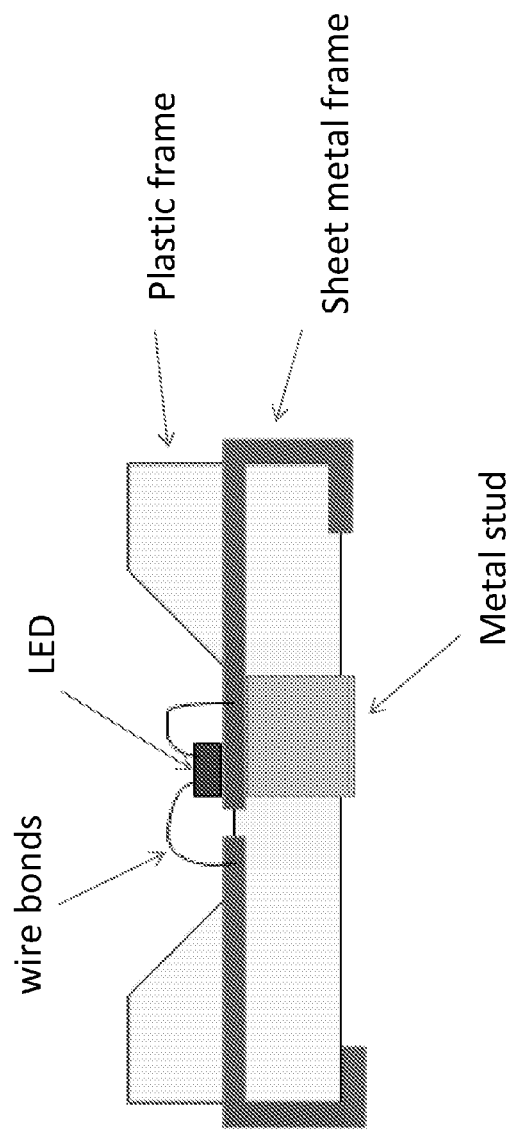
FIG. 2 shows an example of a low cost LED package design with a thermally conductive stud.

FIG. 2 illustrates a different LED package design based on the techniques described in this document where a metal stud is provided in the bottom of the LED package through the plastic body of the LED package design in FIG. 1. The metal stud is in contact with the sheet metal frame and is positioned right below the LED on the top of the sheet metal frame. The metal stud penetrates through the plastic body and has an end that is exposed on the other side of the plastic body to allow heat to dissipate outside the LED package. The presence of the metal stud and its contact with the sheet metal frame provides a heat dissipation channel that extracts heat from the LED and the sheet metal frame and transfers the heat from LED to outside of the package. This added heat dissipation via the metal stud allows the LED package to operate a higher power than that of the LED package in FIG. 1.

FIG. 2 is an example of a LED package that includes a plastic body structured to have a hole that penetrates through the plastic body, a metal contact formed on the plastic body at one side of the hole to cover the hole, a LED mounted to the metal contact at a location that spatially overlaps with the hole, and a stud formed in the hole in contact with the metal contact at a first end of the stud and extending to an opening of the hole at a second end of the stud. The stud is formed of a thermally conductive material to transfer heat from the LED through the metal contact and the stud to dissipate the heat at the opening of the hole via the second end of the stud.

In order to make such a design while still keeping the cost low, special fabrication techniques are provided in this document.

Figure 3:
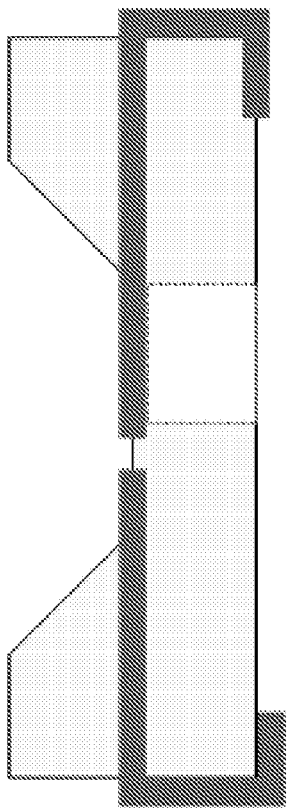
FIGS. 3 and 4 show an exemplary method for fabricating the LED package in FIG. 2.
Figure 4:
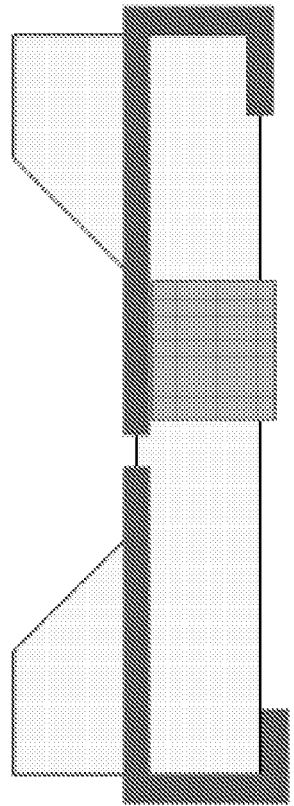

FIGS. 3 and 4 illustrate a method to add metal stud from an existing package. The first step shown in FIG. 3 is to take an existing pre-made plastic frame body package, make a hole on the bottom of the package to expose the sheet metal contact where LED is mounted and located to the hole. The opening of the hole can be formed by various methods, including machining, or sand ballasting, or etching, or some other methods. Once the hole is formed and open, a pre-made metal stud can be attached to the sheet metal contact by, e.g., using a high temperature soldering method, or metal/metal welding, or thermal conductive epoxy, or some other attachment methods. FIG. 4 shows the next step that inserts the metal stud in the hole where one end of the metal stud is in contact with the sheet metal contact underneath the LED and the other end partially protrudes outside the plastic body via the hole opening to transfer heat from LED to the bottom of the package. In addition to using a metal to form the stud, the stud can be made of a material with good and excellent thermal conductivity. For example, the stud may be made of a high temperature solder that provides good thermal conductivity. In this design, a high temperature solder pre-form is made to fit the opening hole, and when high temperature is applied, the pre-form attach to the metal contact. This pre-form solder is chosen that the solder temperature is higher than regular solder used to attach LED to PCB. Another example of design, a control amount of high temperature solder is inject to fill the hole, leave just the right amount of the solder, so one can make thermal contact through the solder filled hole.

Figure 5:
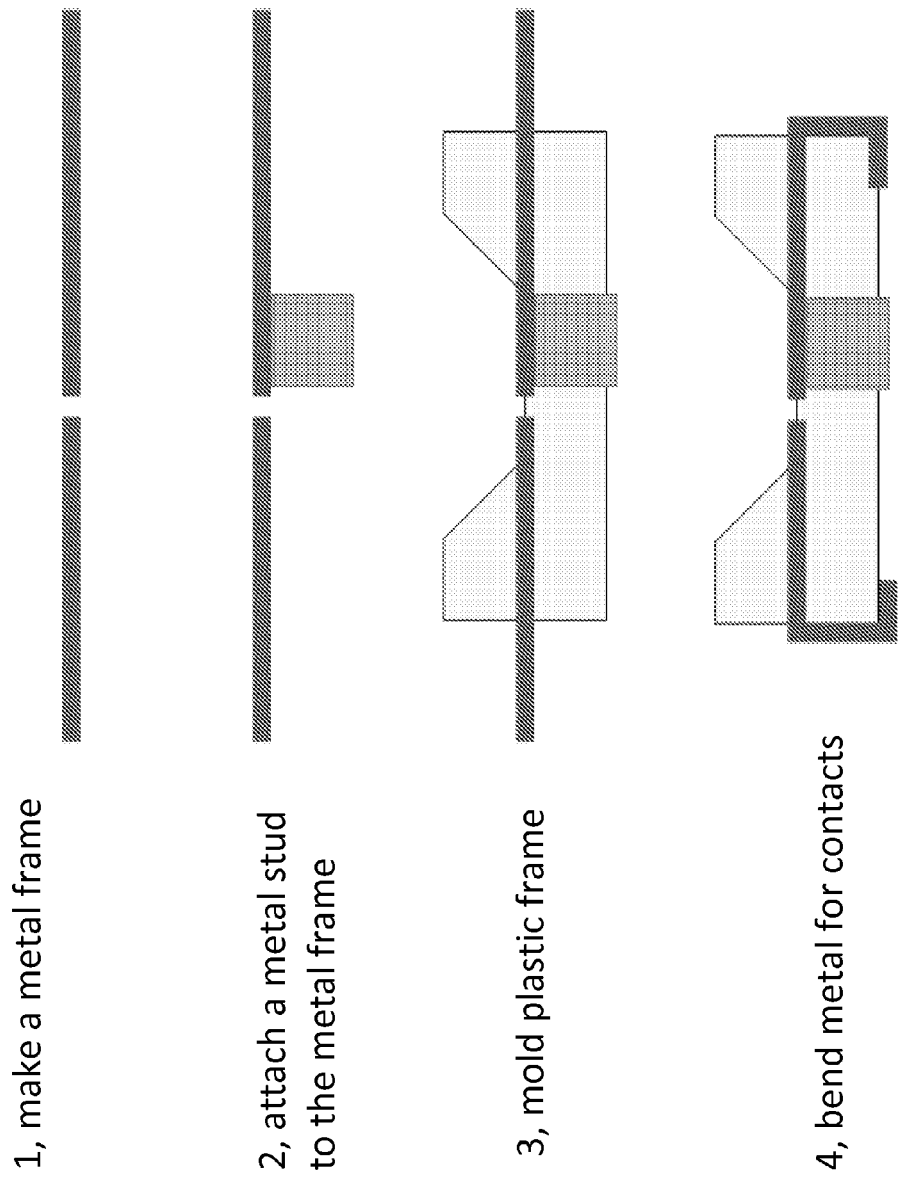
FIG. 5 shows another exemplary method for fabricating the LED package in FIG. 2.

Another method to make the package is to start with sheet metal contact frame, and attach the metal stud to sheet metal contact before the plastic body integration step. The plastic frame body is molded with the metal stud in place, and sheet metal contact is bended to shape. FIG. 5 illustrates an example for making the package in this method. The attached metal stud to metal contact frame can be made with welding, soldering, epoxy etc.

Figure 6:
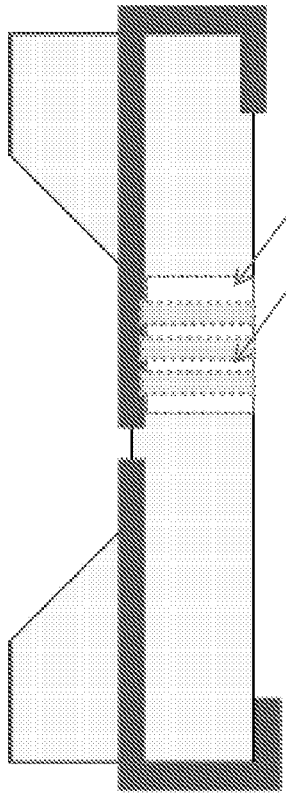
Figure 7:
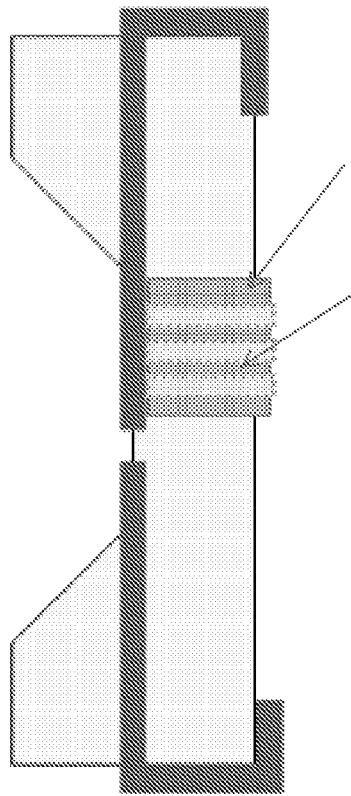

Referring now to FIGS. 6 and 7, another method is to open an array of small holes in the plastic body of the LED package and to fill the high temperature solder or other good thermal conductive material in these small holes to provide multiple thermal transfer channels for dissipating heat from the LED. When the solder is used, the surface tension of the solder can keep the solder inside these holes during the filing process when in the liquid state. The small holes in the plastic body can be formed by, e.g., machining or etching. The temperature for the heating the solder in filling the solder in the holes can be set higher than the temperature for a regular solder in soldering the LED to PCB.

FIG. 8 shows an example for making a LED package design by an injection molding process. In this design, two sets of metal parts with different functions, one set for electrical connections (FIG. 8 A), and another set for LED chip mount and heat sink (FIG. 8 B), are molded together in one step injection molding process (FIG. 8 C). In this design, LED is mounted on the heat sink part with conductive epoxy or solder for best heat transfer performance. The LED chip is electrically connected by wire bond to the electrical connection metal parts (FIG. 8 D).

In one implementation of this design, the metal is made of copper or copper alloys sheet material. The shape of the metal parts can be die cut on the copper sheet. The copper sheet can have thickness of 0.20 to 2.5 mm thickness. The copper sheet can have silver or gold coating. The coating is used to help wire bonding and better surface light reflection. Further more in the implementation of this design; the metal material surface is polished. The polished surface makes the LED contact better heat transfer performance. The plastic material for the plastic body may be made of a white material to improve light output efficiency.

Only a few embodiments are described. Variations and enhancements of the described embodiments and other embodiments can be made based on what is described and illustrated.

What is claimed is:

1. A LED package, comprising:
a plastic body structured to include integrally formed an upper portion and a lower portion and have a hole that penetrates through the lower portion of the plastic body;
a metal contact formed on the plastic body to be interposed between the upper portion and the lower portion and cover the hole at one side of the hole;
a LED mounted to the metal contact at a location that spatially overlaps with the hole; and
a stud formed in the hole in contact with the metal contact at a first end of the stud and extending to an opening of the hole at a second end of the stud, the stud being formed of a thermally conductive material to transfer heat from the LED through the metal contact and the stud to dissipate the heat at the opening of the hole via the second end of the stud.

2. The LED package as in claim 1, wherein the stud is made of a metal.

3. The LED package as in claim 2, where metal stud is attached to the metal contact by soldering.

4. The LED package of claim 2, where metal stud is attached to the metal contact by epoxy.

5. The LED package of claim 1, where the stud is made of a high temperature solder.

6. A LED package, comprising:
a plastic body structured to include integrally formed an upper portion and a lower portion and have an array of holes that penetrate through the lower portion of the plastic body;
a metal contact formed on the plastic body to be interposed between the upper portion and the lower portion and cover the holes at one side of the holes;
a LED mounted to the metal contact at a location that spatially overlaps with the holes; and
thermally conductive channels made of a thermal conductive material that is filled in the holes in contact with the metal contact and each thermally conductive channel extending to an opening of each respective hole to transfer heat from the LED through the metal contact to dissipate the heat at the openings of the holes.

7. The LED package as in claim 6, wherein the thermally conductive material is a metal.

8. The LED package as in claim 6, wherein the thermally conductive material is a solder.

9. A light-emitting diode (LED) device, comprising:
a contiguous injection molded plastic body structured to include a bottom portion configured to have a through hole and a top portion contiguously extended from the bottom portion upward to adopt to the through hole, wherein the contiguous injection molded plastic body is made of a white injection molded plastic material to facilitate light output efficiency;
a metal contact layer formed on the contiguous injection molded plastic body to cover top, side and part of bottom surfaces of the bottom portion while covering the top opening of the through hole to leave the bottom opening of the through hole open, the metal contact layer further configured to expose the top portion of the contiguous injection molded plastic body, and the metal contact layer being polished to provide better heat transfer performance and including an optically reflective coating containing silver or gold to facilitate wire bonding and to improve light out efficiency;
a LED device mounted to the metal contact at a location that spatially overlaps with the through hole;
a thermally conductive stud located in the through hole to include a first stud end in contact with the metal contact layer at the top opening of the through hole to receive heat from the LED device and a second stud end protruding outside the bottom opening of the through hole to release the received heat; and
an electrically conductive wire bonded to the LED device and the optically reflective coating of the metal contact layer for energize the LED device to emit light.

10. The LED device as in claim 9, wherein the metal contact layer is formed of copper and has a thickness of 0.20 mm to 2.5 mm.

11. The LED device as in claim 9, wherein the thermally conductive stud is formed of a high temperature solder filled in the through hole.

* * * * *